US009477003B2

(12) United States Patent
Pribisic et al.

(10) Patent No.: US 9,477,003 B2
(45) Date of Patent: Oct. 25, 2016

(54) COMBINATION CAPACITIVE AND RESISTIVE OBSTACLE SENSOR

(71) Applicant: Magna Closures Inc., Newmarket (CA)

(72) Inventors: Mirko Pribisic, North York (CA); Liviu Bolbocianu, North York (CA); Alex Porat, Thornhill (CA); Thomas Mellary, East Gwillimbury (CA); Timothy Dezorzi, South Lyon, MI (US); Allan Corner, Aurora (CA); Erik Schattenmann, Toronto (CA); Anjan Nayani, North York (CA)

(73) Assignee: Magna Closures Inc., Newmarket (CA)

( * ) Notice: Subject to any disclaimer, the term of this patent is extended or adjusted under 35 U.S.C. 154(b) by 0 days.

(21) Appl. No.: 14/766,937

(22) PCT Filed: Mar. 14, 2014

(86) PCT No.: PCT/IB2014/001117
§ 371 (c)(1),
(2) Date: Aug. 10, 2015

(87) PCT Pub. No.: WO2014/140888
PCT Pub. Date: Sep. 18, 2014

(65) Prior Publication Data
US 2015/0369941 A1 Dec. 24, 2015

Related U.S. Application Data

(60) Provisional application No. 61/791,472, filed on Mar. 15, 2013.

(51) Int. Cl.
| | |
|---|---|
| *G01R 27/08* | (2006.01) |
| *G01L 1/00* | (2006.01) |
| *G01L 5/04* | (2006.01) |
| *G01V 3/08* | (2006.01) |
| *G01R 27/02* | (2006.01) |
| *H03K 17/955* | (2006.01) |
| *B60J 5/10* | (2006.01) |
| *H03K 17/96* | (2006.01) |
| *E05F 15/44* | (2015.01) |
| *E05F 15/46* | (2015.01) |

(52) U.S. Cl.
CPC .................. *G01V 3/08* (2013.01); *B60J 5/101* (2013.01); *E05F 15/44* (2015.01); *E05F 15/46* (2015.01);

(Continued)

(58) Field of Classification Search
CPC ........ G01V 3/02; G01R 27/02; G01R 27/14; G01L 1/205; G01L 1/225; G01G 19/4142; E05F 15/44; E05F 15/443; E05F 15/46; B60R 21/015; E05Y 2900/55; G08B 13/08; H01H 3/142; B60J 10/00
USPC ................... 324/600, 649, 691, 705; 73/849, 73/862.381, 862.391, 862.46, 862.471, 73/862.621, 862.68; 200/61.4, 61.41, 200/61.42, 61.43, 61.44, 61.71, 61.73, 511; 49/26, 27, 28
See application file for complete search history.

(56) References Cited

U.S. PATENT DOCUMENTS

| | | | | |
|---|---|---|---|---|
| 5,072,080 A | * | 12/1991 | Beckhausen | ............. B60J 10/00 200/61.43 |
| 6,483,054 B2 | * | 11/2002 | Suzuki | ..................... B60J 10/00 200/61.43 |

(Continued)

FOREIGN PATENT DOCUMENTS

| | | |
|---|---|---|
| WO | 2007085762 A2 | 8/2007 |
| WO | 2011038514 A1 | 4/2011 |
| WO | 2014043780 A1 | 3/2014 |

OTHER PUBLICATIONS

International Search Report dated Oct. 22, 2014.

*Primary Examiner* — Hoai-An D Nguyen
(74) *Attorney, Agent, or Firm* — Dickinson Wright PLLC

(57) ABSTRACT

An obstacle sensor for a closure panel of a vehicle includes an elongate non-conductive case which encloses a first, second, and third elongate conductive electrodes. The first and second electrodes are separated by a portion of the case, with a capacitance between the first and second electrodes changing when an obstacle approaches the first electrode. The changed capacitance of the obstacle sensor provides a proximity indication of the obstacle to the obstacle sensor. The second and third electrodes are separated by an air gap formed in the case, with a resistance between the second and third electrodes changing when the second and third electrodes come into contact upon compression of the case by the obstacle. The changed resistance of the obstacle sensor provides a contact indication of the obstacle with the obstacle sensor.

19 Claims, 3 Drawing Sheets

(52) U.S. Cl.
CPC ............ *G01R 27/02* (2013.01); *H03K 17/955* (2013.01); *H03K 17/962* (2013.01); *H03K 17/9645* (2013.01); *E05Y 2800/73* (2013.01); *H03K 2217/96054* (2013.01); *H03K 2217/96078* (2013.01)

(56) References Cited

U.S. PATENT DOCUMENTS

| | | | |
|---|---|---|---|
| 6,609,432 B2 * | 8/2003 | Kume | H01H 3/142 |
| | | | 73/862.381 |
| 6,968,746 B2 * | 11/2005 | Shank | B60N 2/002 |
| | | | 73/780 |
| 7,000,352 B2 * | 2/2006 | Ishihara | B60J 10/00 |
| | | | 296/146.8 |
| 7,165,457 B2 * | 1/2007 | Ogino | B60J 10/00 |
| | | | 318/468 |
| 7,202,674 B2 * | 4/2007 | Nakano | H03K 17/955 |
| | | | 324/661 |
| 7,504,601 B2 | 3/2009 | Belmond et al. | |
| 7,855,566 B2 | 12/2010 | Richter | |
| 7,938,473 B2 | 5/2011 | Paton et al. | |
| 8,049,451 B2 | 11/2011 | Patterson et al. | |
| 8,558,558 B2 | 10/2013 | Richter | |
| 2007/0266635 A1 * | 11/2007 | Sugiura | E05F 15/42 |
| | | | 49/27 |
| 2010/0287837 A1 | 11/2010 | Wuerstlein et al. | |
| 2011/0169513 A1 | 7/2011 | Bolbocianu et al. | |
| 2013/0307567 A1 | 11/2013 | Bolbocianu et al. | |
| 2016/0084675 A1 * | 3/2016 | Bolbocianu | G01V 3/02 |
| | | | 324/691 |

* cited by examiner

FIG. 1
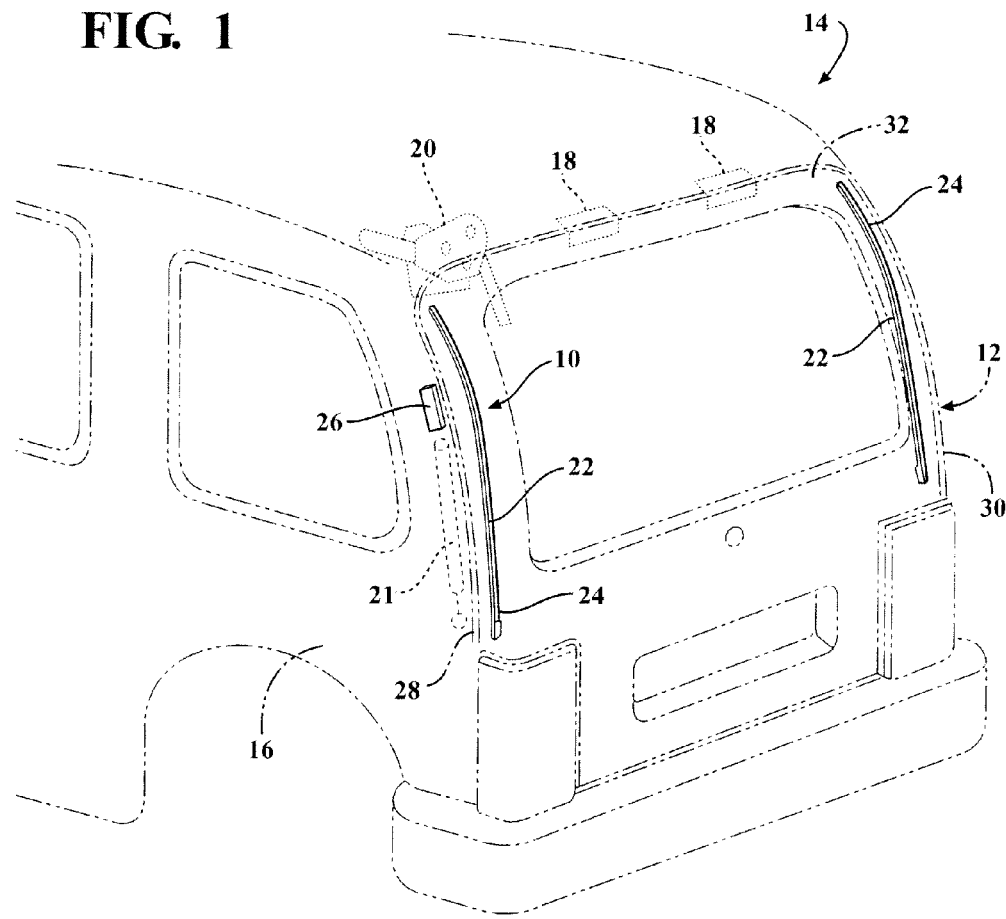
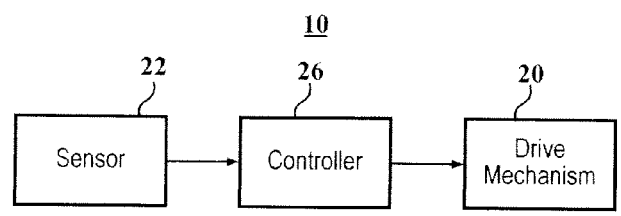
FIG. 2

COMBINATION CAPACITIVE AND RESISTIVE OBSTACLE SENSOR

CROSS-REFERENCE TO RELATED APPLICATION

This application is a National Stage of International Application No. PCT/IB2014/001117 filed on Mar. 14, 2014 which claims the benefit and priority of U.S. provisional patent application Ser. No. 61/791,472 filed Mar. 15, 2013. The entire disclosure of each of the above applications is incorporated herein by reference.

FIELD OF THE INVENTION

This invention relates to the field of obstacle sensors, and more specifically, to a combination capacitive and resistive obstacle sensor for use in vehicles and other devices.

BACKGROUND

In motor vehicles such as minivans, sport utility vehicles and the like, it has become common practice to provide the vehicle body with a large rear opening. A liftgate (also referred to as a tailgate) is typically mounted to the vehicle body or chassis with hinges for pivotal movement about a transversely extending axis between an open position and a closed position. Typically, the liftgate may be operated manually or with a power drive mechanism including a reversible electric motor.

During power operation of a vehicle liftgate, the liftgate may unexpectedly encounter an object or obstacle in its path. It is therefore desirable to cease its powered movement in that event to prevent damage to the obstacle and/or to the liftgate by pinching of the obstacle between the liftgate and vehicle body proximate the liftgate hinges.

Obstacle sensors are used in such vehicles to prevent the liftgate from closing if an obstacle (e.g., a person, etc.) is detected as the liftgate closes. Obstacle sensors come in different forms, including non-contact or proximity sensors and contact sensors (e.g., pinch sensors) which rely on physical deformation caused by contact with an obstacle. Non-contact or proximity sensors are typically based on capacitance changes while contact sensors are typically based on resistance changes.

Non-contact sensors typically include a metal strip or wire which is embedded in a plastic or rubber strip which is routed along and adjacent to the periphery of the liftgate. The metal strip or wire and the chassis of the vehicle collectively form the two plates of a sensing capacitor. An obstacle placed between these two plates changes the dielectric constant and thus varies the amount of charge stored by the sensing capacitor over a given period of time. The charge stored by the sensing capacitor is transferred to a reference capacitor in order to detect the presence of the obstacle.

Contact sensors are typically applied in the form of a rubber strip which is routed along and adjacent to the periphery of the liftgate. The rubber strip embeds two wires which are separated by an air gap. When the two wires contact one another, the electrical resistance therebetween drops, and a controller connected to the two wires monitors the drop in resistance, detecting an object when the drop exceeds a predetermined threshold. One problem with such contact sensors, however, is that they have a limited activation angle typically on the order of about thirty five degrees. Thus, in the event the pinch force is applied obliquely rather than head on, the wires may not contact one another.

A need therefore exists for an improved obstacle sensor for use in vehicles and other devices. Accordingly, a solution that addresses, at least in part, the above and other shortcomings is desired.

SUMMARY OF THE INVENTION

According to one aspect of the invention, there is provided an obstacle sensor, comprising: an elongate non-conductive case enclosing first, second, and third elongate conductive electrodes; the first and second electrodes being separated by a portion of the case, a capacitance between the first and second electrodes changing when an obstacle approaches the first electrode to provide a proximity indication; and, the second and third electrodes being separated by an air gap formed in the case, a resistance between the second and third electrodes changing when the second and third electrodes come into contact upon compression of the case by the obstacle to provide a contact indication.

BRIEF DESCRIPTION OF THE DRAWINGS

Features and advantages of the embodiments of the present invention will become apparent from the following detailed description, taken in combination with the appended drawings, in which:

FIG. 1 is rear perspective view illustrating an obstacle sensing system for a liftgate of a vehicle in accordance with an embodiment of an aspect of the invention;

FIG. 2 is a block diagram illustrating the obstacle sensing system of FIG. 1 in accordance with an embodiment of an aspect of the invention;

It will be noted that throughout the appended drawings, like features are identified by like reference numerals.

DETAILED DESCRIPTION OF THE EXEMPLARY EMBODIMENTS

Figure 3:
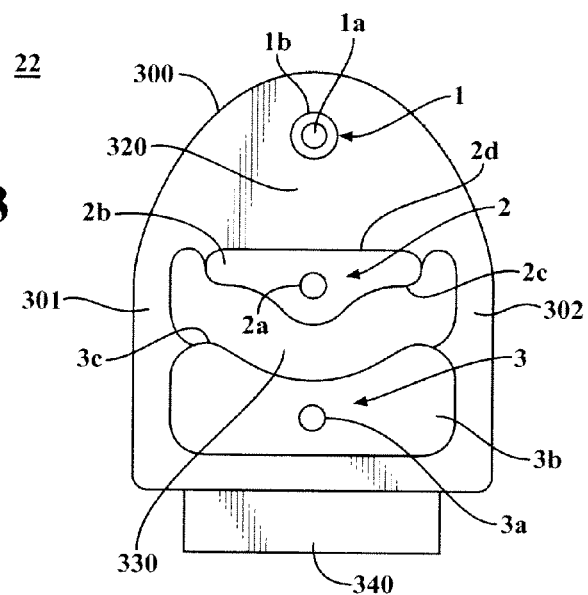
FIG. 3 is a cross sectional view illustrating an obstacle sensor in accordance with an embodiment of an aspect of the invention.

In the following description, details are set forth to provide an understanding of the invention. In some instances, certain circuits, structures and techniques have not been described or shown in detail in order not to obscure the invention.

FIG. 1 is rear perspective view illustrating an obstacle sensing system 10 for a liftgate 12 of a vehicle 14 in accordance with an embodiment of an aspect of the invention. And, FIG. 2 is a block diagram illustrating the obstacle sensing system 10 of FIG. 1 in accordance with an embodiment of an aspect of the invention. The obstacle sensing system 10 is shown operatively associated with a closure panel 12 of a motor vehicle 14. According to one embodiment, the closure panel is a liftgate 12. It will be understood by those skilled in the art that the obstacle sensing system 10 may be used with other closure panels and windows of a vehicle or other device.

The liftgate 12 is mounted to a body 16 of the motor vehicle 14 through a pair of hinges 18 to pivot about a transversely extending pivot axis with respect to a large opening 500 (see FIG. 5) in the rear of the body 16. The liftgate 12 is mounted to articulate about its hinge axis between a closed position where it closes the opening 500 and an open position where it uncovers the opening 500 for free access to the vehicle body interior and assumes a slightly upwardly angled position above horizontal. The liftgate 12 is secured in its closed position by a latching mechanism (not shown). The liftgate 12 is opened and closed by a drive mechanism 20 with the optional assist of a pair of gas springs 21 connected between the liftgate 12 and the body 16. The drive mechanism 20 may be similar to that described in PCT International Patent Application No. PCT/CA2012/000870, filed Sep. 20, 2012, and incorporated herein by reference. The drive mechanism 20 may be or include a powered strut as described in U.S. Pat. No. 7,938,473, issued May 20, 2011, and incorporated herein by reference.

According to one embodiment, the obstacle sensing system 10 includes two obstacle sensors 22, a mounting channel or track 24 for each of the sensors 22, and a controller 26. The pair of sensors 22 are positioned proximate to laterally opposing sides 28 and 30 of the liftgate 12. Both of the sensors 22 include an upper end in close proximity to an upper lateral edge 32 of the liftgate 12. The sensors 22 extend downwardly from their upper ends along a substantial portion of the liftgate 12. The sensors 22 are both electrically attached to a wire harness 430 adapted to plug into the controller 26. The controller 26 controls the drive mechanism 20 to open the liftgate 12 in the event it receives an electrical signal from one or more of the sensors 22.

According to one embodiment, each of the sensors 22 is mounted to the liftgate 12 through a mounting track 24. The mounting tracks 24 may be substantial mirror images of one another. For this reason, only one of the mounting tracks 24 needs to be described herein. The mounting track 24 provides a mounting surface for the sensor 22 which can deflect after the sensor 22 compresses and sends a control signal to the controller 26. This deflection allows the controller 26 sufficient time to reverse the drive mechanism 20 without damaging the obstacle, the liftgate 12 or the drive mechanism 20. The mounting track 24 also provides a gradually changing surface to which the sensor 22 may be mounted. According to one embodiment, the sensors 22 are mounted to the mounting tracks 24, which are in turn attached to the liftgate 12. Alternatively, it will be understood that in certain applications it may be desirable to mount the sensors 22 and their associated tracks 24 on the body 16 of the vehicle 14 adjacent to the liftgate 12.

In operation, when the liftgate 12 contacts or approaches an obstacle proximate to the sensor 22 as it is articulated towards its closed position, the sensor 22 is activated. The activation of the sensor 22 is detected by the controller 26. In response, the controller 26 reverses the drive mechanism 20 to articulate the liftgate 12 to its open position.

The drive mechanism 20 is controlled in part by the obstacle sensing system 10. The obstacle sensing system 10 includes elongate sensors 22 that help prevent the liftgate 12 from pinching or crushing an obstacle such a person's finger (not shown) that may be extending through the opening 500 when the liftgate 12 lowers towards or nears its closed position. It will be appreciated by those skilled in the art that the obstacle sensing system 10 may be applied to any motorized or automated closure panel structure that moves between an open position and a closed position. For example, a non-exhaustive list of closure panels includes window panes, sliding doors, tailgates, sunroofs and the like. For applications such as window panes or sun roofs, the elongate sensors 22 may be mounted on the body 16 of the vehicle 14, and for applications such as powered liftgates and sliding doors the elongate sensor 22 may be mounted on the closure panel itself, e.g., at the leading edge of a sliding door or the side edges of a liftgate 12.

Figure 4:
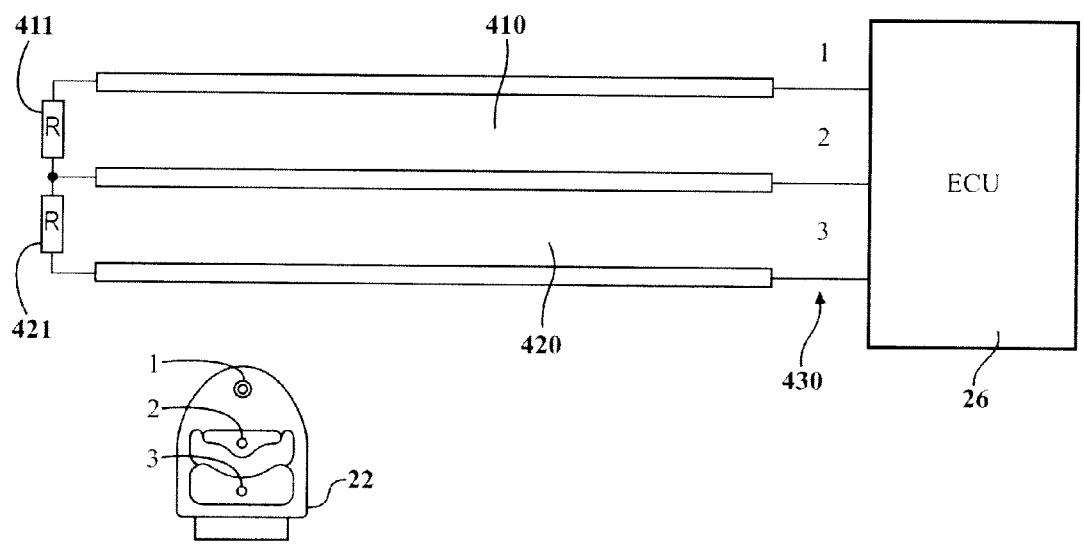
FIG. 4 is a wiring diagram illustrating connection of an obstacle sensor to a controller in accordance with an embodiment of an aspect of the invention.
Figure 5:
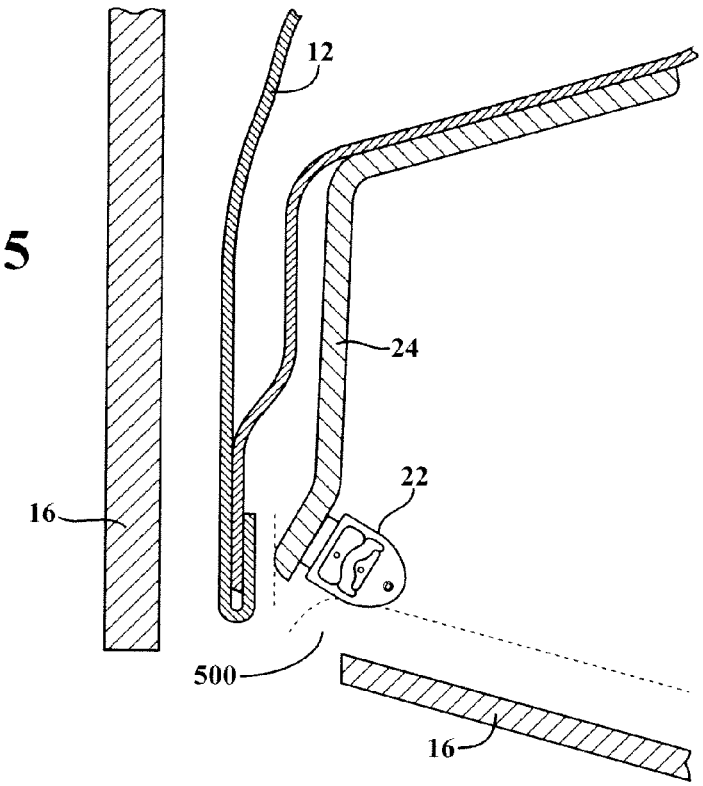
FIG. 5 is a cross sectional view illustrating an obstacle sensor mounted on a liftgate in accordance with an embodiment of an aspect of the invention; and, FIG. 6 is a flow chart illustrating operations of modules within an obstacle sensing system for detecting contact with or proximity of an obstacle, in accordance with an embodiment of an aspect of the invention.

FIG. 3. is a cross sectional view illustrating an obstacle sensor 22 in accordance with an embodiment of an aspect of the invention. FIG. 4 is a cross sectional view illustrating an obstacle sensor 22 mounted on a liftgate 12 in accordance with an embodiment of an aspect of the invention. And, FIG. 5 is a wiring diagram illustrating connection of an obstacle sensor 22 to a controller 26 in accordance with an embodiment of an aspect of the invention.

The obstacle sensor 22 is a hybrid three electrode sensor that allows for both a resistive mode and a capacitive mode of obstacle detection. In general, the resistive mode operates through the middle (second) and lower (third) electrodes 2, 3. The capacitive mode operates through the upper (first) and middle (second) electrodes 1, 2 and/or with all three electrodes 1, 2, 3. In capacitive mode, the upper and middle electrodes 1, 2 function in a driven shield configuration (i.e., with the middle electrode 2 being the driven shield) with the lower electrode 3 being an optional ground. The case 300 positions the three electrodes 1, 2, 3 in an arrangement that facilitates operation of the sensor 22 in both a capacitive mode and a resistive mode.

In capacitive mode, the upper electrode 1 (optionally comprising a conductor 1a embedded in conductive resin 1b) acts as a capacitive sensor electrode, and the middle electrode 2 (optionally comprising a conductor 2a embedded in conductive resin 2b) acts as a capacitive shield electrode. A dielectric 320 (e.g., a portion 320 of the case 300) is disposed between the middle electrode 2 and the upper electrode 1 to isolate and maintain the distance between the two. The controller (or sensor processor ("ECU")) 26 is in electrical communication with the electrodes 1, 2 for processing sense data received therefrom.

In resistive mode, the middle electrode 2 acts as an upper resistive element and the lower electrode 3 acts as a lower resistive element. As best shown in FIG. 4, the middle and lower electrodes 2, 3 are connected at one end of the sensor 22 to a pre-determined resistor 421 and at the other end to a wire harness 430 and the controller 26. The middle and lower electrodes 2, 3 are separated by an air gap 330 formed within the case 300 and bounded by compressible or deflectable spring side walls 301, 302 of the case 300. When an obstacle contacts the sensor 22 with enough force and within the activation angle range of the sensor 22, it deflects the upper portion of the sensor 22 and brings the middle and lower electrodes 2, 3 into contact. This lowers the resistance of the sensor 22 to a level that is detectable by the controller 26 which is in electrical communication with the middle and lower electrodes 2, 3 for processing sense data received therefrom.

According to one embodiment, the obstacle sensor 22 includes an elongate non-conductive case 300 having three elongate conductive electrodes 1, 2, 3 extending along its length. The electrodes 1, 2, 3 are encapsulated in the case 300 and are normally spaced apart. When the sensor 22 is compressed in a direction substantially parallel to its length by an obstacle, the middle and lower electrodes 2, 3 make contact so as to generate an electrical signal indicative of contact with the obstacle. When an obstacle comes between the tailgate 12 and the body 16 of vehicle 14, it effects the electric field generated by the upper electrode 1 which results in a change in capacitance between the upper and middle electrodes 1, 2 which is indicative of the proximity of the obstacle to the liftgate 12. Hence, the middle and lower electrodes 2, 3 function as a resistive contact sensor while the upper and middle electrodes 1, 2 function as a capacitive non-contact or proximity sensor.

According to one embodiment, the upper (first) electrode 1 may include a first conductor 1a embedded in a first partially conductive body 1b, the middle (second) electrode 2 may include a second conductor 2a embedded in a second partially conductive body 2b, and the lower (third) electrode 3 may include a third conductor 3a embedded in a third partially conductive body 3b. The conductors 1a, 2a, 3a may be formed from a metal wire. The partially conductive bodies 1b, 2b, 3b may be formed from a conductive resin. And, the case 300 may be formed from a non-conductive (e.g., dielectric) material (e.g., rubber, etc.). Again, the upper electrode 1 is separated from the middle electrode 2 by a portion 320 of the case 300. The middle electrode 2 is separated from the lower electrode 3 by an air gap 330 formed in the case 300.

According to one embodiment, the obstacle sensor 22 is mounted on the liftgate 12 as shown in FIGS. 1 and 5. The sensor 22 may be fastened to the liftgate 12 by an adhesive tape 340 provided along the base of the sensor's case 300.

According to one embodiment, the case 300 may be formed as an extruded, elongate, elastomeric trim piece with co-extruded conductive bodies 1b, 2b, 3b and with the conductors 1a, 2a, 3a molded directly into the bodies 1b, 2b, 3b. The trim piece may be part of the liftgate water sealing system, i.e., form part of a seal, it may form part of the decorative fascia of the vehicle 14, or it may form part of the interior trim of the liftgate 12.

As shown in FIG. 4, a capacitive sensor circuit 410 is formed by the capacitive sensor electrode 1, a first terminal resistor 411, and the capacitive shield/upper resistive sensor electrode 2. In addition a resistive sensor circuit 420 is formed by the capacitive shield/upper resistive sensor electrode 2, a second terminal resistor 421, and the lower resistive sensor electrode 3. The resistors 411, 421 are diagnostic resistors for the senor circuits 410, 420. Both the capacitive sensor circuit 410 and the resistive sensor circuit 420 are coupled to and driven by the controller 26.

With respect to resistive sensing, the air gap 330 electrically insulates the middle electrode 2 and the lower electrode 3. However, the spring side walls 301, 302 of the sensor case 300 are flexible enough to enable the outer surfaces 2c, 3c of the partially conductive bodies 2b, 3b of the two electrodes 2, 3 to touch one another when the sensor 22 is compressed (e.g., as a result of a pinch event). The flexibility of the sensor 22 may be controlled by its cross sectional configuration, including controlling the thickness of the side walls 301, 302 of the case 300 and the thickness of the partially conductive bodies 2b, 3b. The outer surfaces 2c, 3c of the partially conductive bodies 2b, 3b are shaped to increase the activation angle (i.e., the angle from the normal at which a compressive or pinch force is applied to the sensor 22) of the sensor 22. According to one embodiment, the outer surface 2c of the middle electrode 2 may have a ball shape and the outer surface 3c of lower electrode 3 may have a socket shape as shown in FIG. 3.

The controller 26 measures the resistance (or resistance value) between the middle electrode 2 and the lower electrode 3. The resistance will be large in magnitude when the partially conductive bodies 2b, 3b are separated from each other by the air gap 330, and will reduce in magnitude if a portion of the partially conductive bodies 2b, 3b contact one another when the sensor 22 is compressed. This drop in measured resistance is indicative of contact with an obstacle (i.e., a pinch event).

With respect to capacitive sensing, a portion 320 of the case 300 electrically insulates the upper electrode 1 and the middle electrode 2 so that electrical charge can be stored therebetween in the manner of a conventional capacitor. According to one embodiment, the inner surface 2d of the middle electrode 2 may be shaped to improve the shielding function of the middle electrode 2. According to one embodiment, the inner surface 2d may be flat as shown in FIG. 3.

The sensor 22 is used by the controller 26 to measure a capacitance (or capacitance value) of an electric field extending through the opening 500 under the liftgate 12. According to one embodiment, the middle electrode 2 functions as a shielding electrode since it is positioned closer to the sheet metal of the liftgate 12. As such, the electric field sensed by the upper electrode 1 will be more readily influenced by the closer middle electrode 2 than the vehicle sheet metal. To improve signal quality, the liftgate 12 may be electrically isolated from the remainder of the vehicle 14. A powered sliding door, for example, may be isolated through the use of non-conductive rollers.

The capacitance (or capacitance value) of the sensor 22 is measured as follows. The capacitive sensor electrode 1 and the capacitive shield/upper resistive sensor electrode 2 are charged by the controller 26 to the same potential using a pre-determined pulse train. For each cycle, the controller 26 transfers charge accumulated between the electrodes 1, 2 to a larger reference capacitor (not shown), and records an electrical characteristic indicative of the capacitance of the sensor 22. The electrical characteristic may be the resultant voltage of the reference capacitor where a fixed number of cycles is used to charge the electrodes 1, 2, or a cycle count (or time) where a variable number of pulses are used to charge the reference capacitor to a predetermined voltage. The average capacitance of the sensor 22 over the cycles may also be directly computed. When an obstacle enters the opening 500 under the liftgate 12, the dielectric constant between the electrodes 1, 2 will change, typically increasing the capacitance of the sensor 22 and thus affecting the recorded electrical characteristic. This increase in measured capacitance is indicative of the presence of the obstacle (i.e., its proximity to the liftgate 12).

Figure 6:
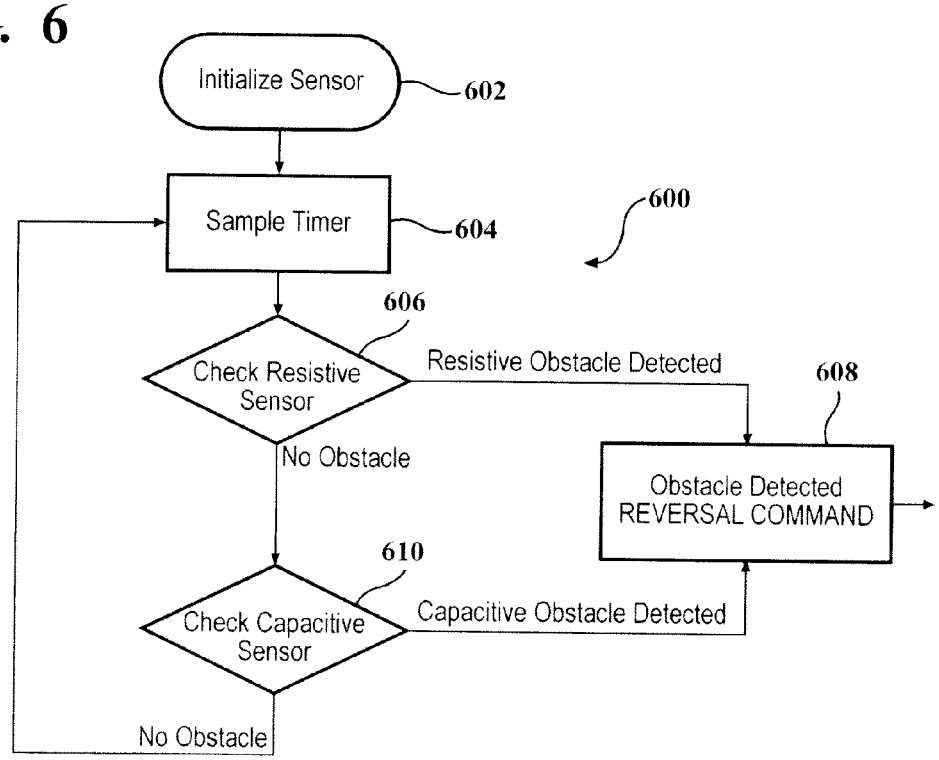

FIG. 6 is a flow chart generally illustrating 600 a method of operating a resistance module and a capacitance module within an obstacle sensing system 10 for detecting contact with or proximity of an obstacle, in accordance with an embodiment of an aspect of the invention. According to one embodiment, as shown in FIG. 6, the obstacle sensing system 10 may use both capacitive and resistive sensing modes to detect contact with or proximity of an obstacle. Software modules within the controller 26 may toggle between resistive and capacitive sensing operations. For example, the method beings by 602 initializing the sensor 22 or sensors 22 of the obstacle sensing system 10, followed by an 604 initiation of a sample timer. The sample time can include a predetermined cycle time, such as seconds, in which to check the capacitive and sensing modes of the sensor(s) 22. Once the sample timer has been initiated, the method proceeds by 606 checking the resistive sensor mode of the sensor 22. If a change in the resistance between the second and third electrodes 2, 3 is detected, the method proceeds to 608 initiate a "REVERSAL COMMAND" to the drive mechanism to cease a closing movement of the closure panel. If no change in the resistance between the second and third electrodes 2, 3 is detected, the method proceeds by 610 checking the capacitive sensor mode of the sensor 22. If a change in a capacitance between the first and second electrodes 1, 2 is detected, the method proceeds to 608 initiate a "REVERSAL COMMAND" to the drive mechanism to cease a closing movement of the closure panel. If no change in the capacitance between the first and second electrodes 1, 2 is detected, the method proceeds to 602 re-initiate the sample timer.

The above embodiments contribute to an improved obstacle sensor 22 and provide one or more advantages. First, by detecting proximity of an obstacle by capacitive sensing, overloading of the sensor 22 and the pinched obstacle during the time lag encountered by the powered opening of the liftgate 12 is reduced. Second, the sensor 22 allows for the use of resistive contact sensing as a back-up to capacitive proximity sensing.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed:

1. An obstacle sensor for a closure panel of a vehicle, comprising:
    an elongate non-conductive case enclosing a first, second, and third elongate conductive electrodes;
    said first and second electrodes being separated by a portion of said case, a capacitance between said first and second electrodes changing when an obstacle approaches said first electrode to provide a proximity indication of the obstacle to the obstacle sensor; and
    said second and third electrodes being separated by an air gap formed in the case, a resistance between said second and third electrodes changing when the second and third electrodes come into contact upon compression of the case by the obstacle to provide a contact indication of the obstacle with the obstacle sensor, wherein said second and third electrodes are bounded by compressible spring side walls of said case to allow said second and third electrodes to contact one another when the obstacle sensor is contacted by the obstacle.

2. An obstacle sensor as set forth in claim 1, wherein said portion of said case includes a dielectric disposed between said first and second electrodes to isolate said first and second electrodes and maintain a spacing distance therebetween.

3. An obstacle sensor as set forth in claim 1, wherein the obstacle sensor is configured to be mounted to the closure panel for positioning said third electrode proximate the closure panel, positioning said second electrode farther away from the closure panel relative to said third electrode, and positioning said first electrode farthest away from the closure panel relative to both said second and third electrodes.

4. An obstacle sensor as set forth in claim 1, wherein said compressible spring side walls each have a predetermined side wall thickness to control a flexibility of the obstacle sensor during contact with the obstacle.

5. An obstacle sensor as set forth in claim 1, wherein said first electrode includes a first conductor embedded in a first partially conductive body.

6. An obstacle sensor as set forth in claim 5, wherein said second electrode includes a second conductor embedded in a second partially conductive body and said third electrode includes a third conductor embedded in a third partially conductive body.

7. An obstacle sensor as set forth in claim 6, wherein each of said partially conductive bodies of said second and third electrodes include an outer surface being shaped to increase an activation angle of the obstacle sensor.

8. An obstacle sensor as set forth in claim 7, wherein said outer surface of said second partially conductive body is ball-shaped and said outer surface of said third partially conductive body is socket-shaped.

9. An obstacle sensor as set forth in claim 6, wherein said second partially conductive body includes an inner surface being shaped to improve a shielding function of said second electrode.

10. An obstacle sensor as set forth in claim 9, wherein said inner surface of said second partially conductive body is flat.

11. An obstacle sensor as set forth in claim 1, further comprising:
    said first and second electrodes each electrically connected at a first end of the obstacle sensor to a first resistor and in electrical communication at a second end of the obstacle sensor with a controller to form a capacitive sensor circuit of the obstacle sensor; and
    said second and third electrodes each electrically connected at the first end of the obstacle sensor to a second resistor and in electrical communication at the second end of the obstacle sensor with said controller to form a resistive sensor circuit of the obstacle sensor.

12. An obstacle sensor as set forth in claim 11, wherein said controller is configured to detect the change in the capacitance between said first and second electrodes when the obstacle approaches the first electrode and is further configured to detect the change in the resistance between said second and third electrodes when said second and third electrodes come into contact with one another upon compression of said case by the obstacle.

13. An obstacle sensor as set forth in claim 12, wherein said controller is electrically connected to a drive mechanism of the closure panel and configured to cease operation of the drive mechanism in response to detecting either the change in the capacitance between said first and second electrodes or the change in resistance between said second and third electrodes.

14. An obstacle sensor as set forth in claim 11, wherein each of the first, second, and third electrodes are electrically attached to a wire harness at the second end of the obstacle sensor, said wire harness adapted to plug into said controller.

15. An obstacle sensor for a closure panel of a vehicle, comprising:
    an elongate non-conductive case enclosing a first, second, and third elongate conductive electrodes;
    said first and second electrodes being separated by a portion of said case, a capacitance between said first and second electrodes changing when an obstacle approaches said first electrode to provide a proximity indication of the obstacle to the obstacle sensor; and said second and third electrodes being separated by an air gap formed in the case, a resistance between said second and third electrodes changing when the second and third electrodes come into contact upon compression of the case by the obstacle to provide a contact indication of the obstacle with the obstacle sensor;

wherein the obstacle sensor is configured to be mounted to the closure panel for positioning said third electrode proximate the closure panel, positioning said second electrode farther away from the closure panel relative to said third electrode, and positioning said first electrode farthest away from the closure panel relative to both said second and third electrodes.

16. An obstacle sensor for a closure panel of a vehicle, comprising:

an elongate non-conductive case enclosing a first, second, and third elongate conductive electrodes;

said first and second electrodes being separated by a portion of said case, a capacitance between said first and second electrodes changing when an obstacle approaches said first electrode to provide a proximity indication of the obstacle to the obstacle sensor;

said second and third electrodes being separated by an air gap formed in the case, a resistance between said second and third electrodes changing when the second and third electrodes come into contact upon compression of the case by the obstacle to provide a contact indication of the obstacle with the obstacle sensor;

said first and second electrodes each electrically connected at a first end of the obstacle sensor to a first resistor and in electrical communication at a second end of the obstacle sensor with a controller to form a capacitive sensor circuit of the obstacle sensor; and said second and third electrodes each electrically connected at the first end of the obstacle sensor to a second resistor and in electrical communication at the second end of the obstacle sensor with said controller to form a resistive sensor circuit of the obstacle sensor.

17. An obstacle sensor as set forth in claim 16, wherein said controller is configured to detect the change in the capacitance between said first and second electrodes when the obstacle approaches the first electrode and is further configured to detect the change in the resistance between said second and third electrodes when said second and third electrodes come into contact with one another upon compression of said case by the obstacle.

18. An obstacle sensor as set forth in claim 17, wherein said controller is electrically connected to a drive mechanism of the closure panel and configured to cease operation of the drive mechanism in response to detecting either the change in the capacitance between said first and second electrodes or the change in resistance between said second and third electrodes.

19. An obstacle sensor as set forth in claim 16, wherein each of the first, second, and third electrodes are electrically attached to a wire harness at the second end of the obstacle sensor, said wire harness adapted to plug into said controller.

* * * * *